United States Patent [19]

Gibson et al.

[11] Patent Number: 4,760,602
[45] Date of Patent: Jul. 26, 1988

[54] VARIABLE PREEMPHASIS/DEEMPHASIS NETWORK

[75] Inventors: John J. Gibson, Princeton, N.J.; Todd J. Christopher, Indianapolis, Ind.

[73] Assignee: RCA Licensing Corporation, Princeton, N.J.

[21] Appl. No.: 921,242

[22] Filed: Oct. 21, 1986

[51] Int. Cl.[4] .............................................. H03G 7/00
[52] U.S. Cl. ...................................... 381/106; 333/14
[58] Field of Search ..................... 333/14; 381/106, 98

[56] References Cited

U.S. PATENT DOCUMENTS

| | | | |
|---|---|---|---|
| 4,218,662 | 8/1980 | Schröder | 333/14 |
| 4,243,944 | 1/1981 | Schröder | 333/14 |
| 4,306,202 | 12/1981 | Schröder | 333/14 |
| 4,398,157 | 8/1983 | Dieterich | 381/106 |
| 4,432,097 | 2/1984 | Okada et al. | 381/98 |
| 4,629,995 | 12/1984 | Katakura | 330/149 |
| 4,661,851 | 4/1987 | Muterspaugh | 358/144 |

FOREIGN PATENT DOCUMENTS 2076263  11/1981  United Kingdom ............... 381/106

OTHER PUBLICATIONS

"A Companding System for Multichannel TV Sound"; L. B. Tyler et al.; IEEE Trans on Consumer Elec.; vol. CE-30 #4, Nov. 1984.

Primary Examiner—Forester W. Isen
Attorney, Agent, or Firm—Eugene M. Whitacre; Paul J. Rasmussen; Eric P. Herrmann

[57] ABSTRACT

A variable preemphasis/deemphasis network is disclosed which is coupled between audio input and output terminals. The network exhibits a family of transfer function response characteristics which vary between a full deemphasis characteristic $H(f)$ and a full emphasis characteristic $1/H(f)$ in response to a control signal and exhibits complementary transfer function response characteristics in response to reciprocal valued control signals. The network includes a signal filter which determines the shape of the transfer function response characteristic, and a gain controlled amplifier which determines which one of the family of transfer function response characteristics is exhibited in response to the control signal.

19 Claims, 3 Drawing Sheets

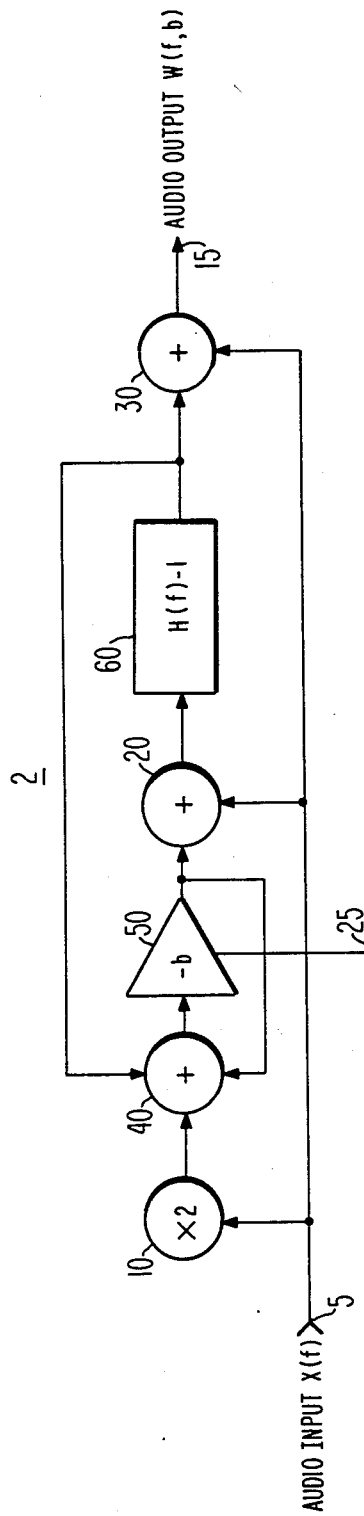
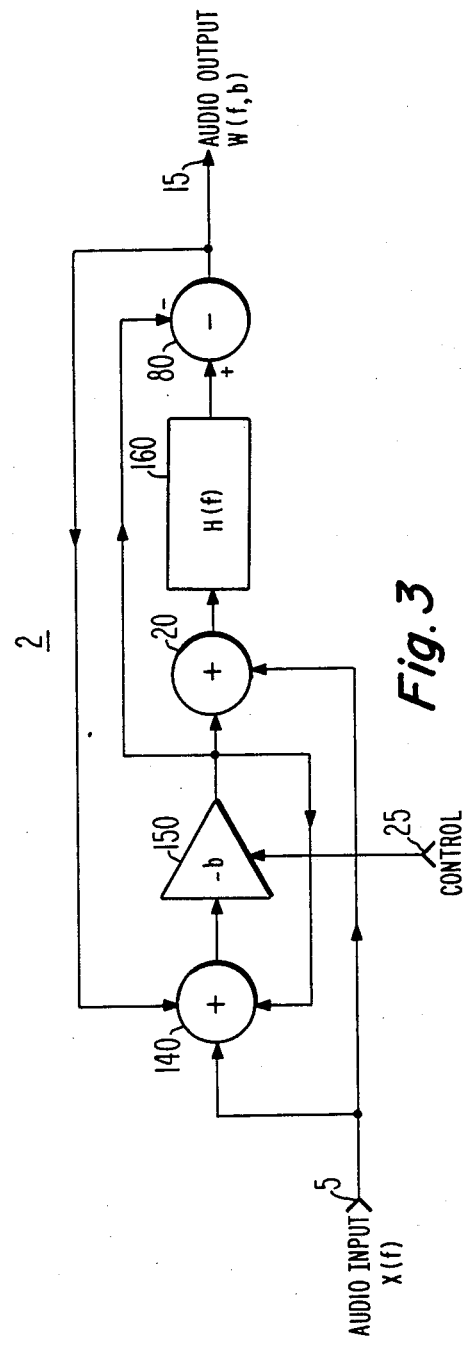
Fig. 4
Fig. 3

VARIABLE PREEMPHASIS/DEEMPHASIS NETWORK

The present invention relates to a sound signal processing system including a variable preemphasis/deemphasis network for providing compression/expansion in a second audio program (SAP) or stereophonic television sound (L-R) signal channel for noise reduction.

In 1984, on a recommendation by the Broadcast Television Systems Committee (BTSC) of the Electronic Industries Association (EIA), the Federal Communications Commission (FCC) adopted a standard for Multichannel Television Sound (MTS). FCC Office of Science and Technology Bulletin OET60 (Revision A, February 1986) describes the BTSC system for transmitting a stereophonic and SAP signal compatibly with present television transmission standards. In order to provide the required signal-to-noise ratio, the system described includes a noise reduction system. One part of the BTSC noise reduction system is a variable compression/expansion processing step for the higher frequency band of the audio signal transmitted as the SAP, referred to as a spectral compander.

In an article "A Companding System for Multichannel TV Sound" by L. B. Tyler et al. in IEEE Transactions on Consumer Electronics, Vol. CE-30, No. 4, November 1984, a circuit implementing a portion of the FCC approved noise reduction system is described in more detail. In particular, the compression and the expansion processing circuits, respectively, referred to as a spectral compressor and a spectral expander, are described in detail.

These circuits both include a variable preemphasis/deemphasis network. This is an adaptive network which exhibits a transfer characteristic which under voltage control, can vary continuously from a preemphasis to a deemphasis characteristic. The network, shown in the above article, consists of a voltage controlled amplifier (VCA) with a variable gain b which can vary from 0 to a very large number, a first signal filter with a preemphasis transfer characteristic $1/H(f)=H^{-1}(f)$, (where f=frequency), a second signal filter with a deemphasis complex transfer characteristic $H(f)$ which has the complementary response to the transfer characteristic of the first filter, and an adder and a subtractor circuit. A resulting transfer characteristic for a spectral expander is:

$$Q(f,b) = \frac{b + H(f)}{1 + bH(f)} \quad (1)$$

This equation defines a family of transfer characteristics which, when b=0, is a full deemphasis characteristic $H(f)$ and, when b=∞ is a full emphasis characteristic $H^{-1}(f)$. The family of transfer characteristics is such that a complementary response is exhibited in response to reciprocal valued control signals. That is, $Q(f,b)=Q^{-1}(f,1/b)$. The voltage control signal, having the value b, is derived from the RMS value of the audio signal in the higher frequency bands.

Specifically, $H(f)$ is a deemphasis transfer function with two breakpoints and has the following transfer characteristic:

$$H(f) = \frac{1 + p}{1 + cp} \quad (2)$$

where $p=jf/f_p$, f is the frequency in kHz, $f_p=20.1$ kHz and c=51. The breakpoint frequencies are thus 20.1 kHz and $f_p/c=394$ Hz. Insertion of equation (2) into equation (1) yields a relation for the spectral expander:

$$Q(f,b) = \frac{1 + p(bc + 1)/(b + 1)}{1 + p(b + c)/(b + 1)} \quad (3)$$

The function $Q(f,b)$ in equation 3 is the BTSC system transfer function for the spectral expander.

A major disadvantage of the circuit shown in the above article is that two signal filters, one with a transfer characteristic $H(f)$ and the other with the complementary transfer characteristic, i.e. $H^{-1}(f)$, must be implemented. The two signal filters must be accurately matched to each other in terms of both amplitude and phase for the circuit to operate properly. It is desirable to provide a variable preemphasis/deemphasis network which implements the BTSC transfer characteristic but does not require two, closely matched, signal filters.

In accordance with principles of the present invention, a variable preemphasis/deemphasis network is coupled between audio input and output terminals. The network exhibits a family of transfer function response characteristics which vary between a full deemphasis characteristic $H(f)$ and a full emphasis characteristic $1H/(f)$ in response to a control signal and exhibits complementary transfer function response characteristics in response to reciprocal valued control signals. The network includes a signal filter which determines the shape of the transfer function response characteristic, and a gain controlled amplifier which determines which one of the family of transfer function response characteristics is exhibited in response to the control signal.

In the drawings:

FIGS. 3, 4 and 5 are block diagrams of embodiments of variable preemphasis/deemphasis networks in accordance with principles of the present invention which may be used in the spectral compressor or expander illustrated in FIG. 1A or 1B.

FIG. 1A illustrates a known spectral compressor such as may be used as part of a BTSC noise reduction circuit in a television transmitter in the L−R or SAP audio path. FIG. 1B illustrates a known spectral expander such as may be used as part of a BTSC noise reduction circuit in a television receiver in the SAP or L−R audio path.

Figure 1A:
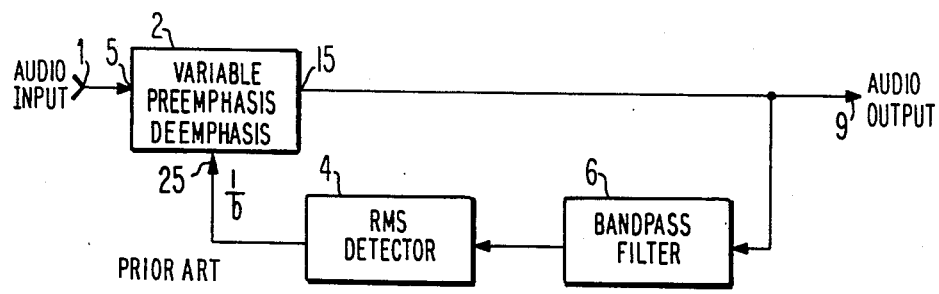
FIGS. 1A and 1B are block diagrams of a prior art spectral compressor and expander respectively.

In FIG. 1A, an audio input terminal 1 is coupled (possibly through other processing circuits) to a source (not shown) of an audio signal; for example, an SAP audio signal generator, or a matrix coupled to left L and right R audio signal sources which generates an L−R signal. Input terminal 1 is coupled to an input terminal 5 of a variable preemphasis/deemphasis network 2. An output terminal 15 of variable preemphasis/deemphasis network 2 is coupled to an audio output terminal 9. Audio output terminal 9 may be coupled (possibly through other processing circuits) to a subcarrier modulator which produces a subcarrier modulated with the compressed SAP or L−R signal which is subsequently combined with the L+R matrixed audio signal for transmission as the sound component of a composite video signal.

Output terminal 15 of variable preemphasis/deemphasis network 2 is also coupled to the serial connection of a bandpass filter 6 and RMS detector 4. The serial connection generates a signal, b which represents the RMS level of the higher-frequency portion of the audio output signal. RMS detector 4 contains further circuitry which produces the reciprocal of this signal, 1/b, as the compansion control signal. This compansion control signal 1/b from the output terminal of RMS detector 4 is coupled to a control input terminal 25 of variable preemphasis/deemphasis network 2.

In operation, the spectral compressor illustrated in FIG. 1A boosts the higher frequencies of audio signals which have relatively low high-frequency energy, and attenuates the higher frequencies of audio signals which have relatively high high-frequency energy. The resulting audio signal contains a substantial amount of high-frequency energy. The likelihood of the channel noise being masked is thus increased.

Figure 1B:
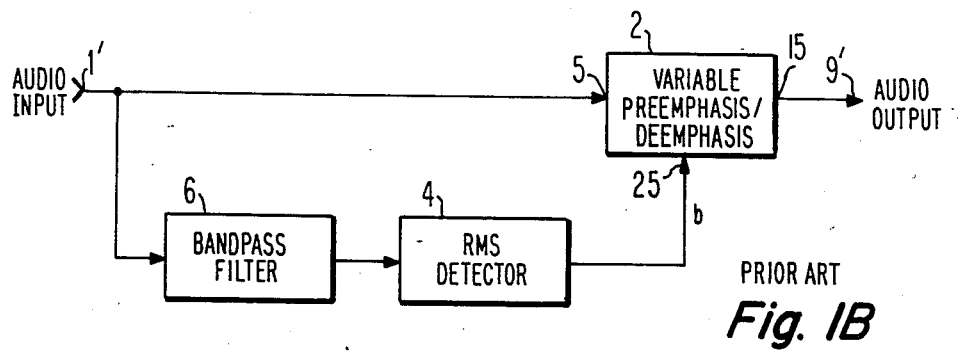

In FIG. 1B, an audio input terminal 1' is coupled (possibly through other processing circuits) to a source (not shown) of a compressed audio signal; for example, the output of an SAP or L−R signal subcarrier demodulator arranged to process the sound component of a received composite video signal. Audio input terminal 1' is coupled to an input terminal 5 of a variable preemphasis/deemphasis network 2. An output terminal 15 of variable preemphasis/deemphasis network 2 is coupled to an audio output terminal 9'. Audio output terminal 9' may be coupled (possibly through other processing circuits) to an SAP audio program processor, or a stereo matrix which generates separated left L and right R signals from the L+R and L−R signals.

Input terminal 1' is also coupled to the serial connection of a bandpass filter 6 and RMS detector 4'. The output terminal of RMS detector 4' produces a compansion control signal, b, which represents the RMS level of the higher-frequency portion of the audio output signal. In this case, RMS detector 4' supplies the control signal b, unchanged to a control input terminal 25 of variable preemphasis/deemphasis network 2.

The preemphasis/deemphasis network 2 and bandpass filter 6 illustrated in the spectral compressor of FIG. 1A are identical to those illustrated in the spectral expander of FIG. 1B. RMS detectors 4 and 4' differ only in the added circuitry in RMS detector 4 to generate a signal 1/b from the signal b representing the RMS level of the higher-frequency audio signal. Bandpass filters 6 and RMS detectors 4 and 4' form the compansion control signal generators of FIGS. 1A and 1B.

In operation, the spectral expander of FIG. 1B performs the inverse operation of that of the spectral compressor of FIG. 1A. The signal at audio output terminal 9' is an approximation of the signal at the audio input terminal 1, but with the background high-frequency noise reduced and the noise mixed with the signal masked by the signal. The variable preemphasis/deemphasis network 2 will be described below in the context of the spectral expander illustrated in FIG. 1B.

Figure 2:
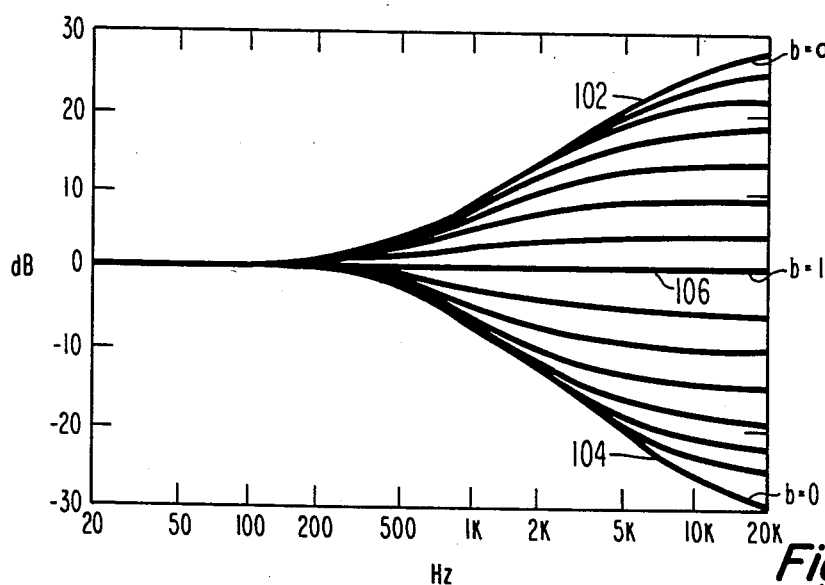
FIG. 2 is a frequency response diagram of the spectral expander illustrated in FIG. 1B.

FIG. 2 illustrates the frequency response diagram of the spectral expander illustrated in FIG. 1B. The family of spectral response curves which describes the transfer function response characteristic of variable preemphasis/deemphasis network 2 is illustrated. They are bounded below by a full deemphasis response characteristic 104 which may be described mathematically as $H(f)$, as given in equation 2 above, and bounded above by a full preemphasis response characteristic 102 which may be described mathematically as $1/H(f)$ or $H^{-1}(f)$. The shapes of the curves are determined by the transfer function $H(f)$. The compansion control signal, b, determines which one of the family of spectral response curves describes the transfer function response characteristic of the spectral expander. When b=0, the transfer response characteristic is described by the full deemphasis response characteristic 104; when b=1, it is described by the flat response characteristic 106; when b=∞, it is described by the full preemphasis response characteristic 102.

FIG. 3 illustrates an embodiment of a variable preemphasis/deemphasis network 2 in accordance with principles of the present invention which may be used in the spectral expander of FIG. 1B (or the spectral compressor of FIG. 1A). In FIG. 3, an audio input terminal 5 is coupled to a source (not shown) of a compressed audio signal, designated by its Fourier transform $X(f)$. Audio input terminal 5 is coupled to respective input terminals of adders 140 and 20. The output terminal of adder 20 is coupled to an input terminal of a signal filter 160 having the transfer function characteristic $H(f)$. $H(f)$ may be the BTSC noise reduction transfer function as given in equation (2) above. An output terminal of signal filter 160 is coupled to a minuend input terminal of a subtractor 80. An output terminal of subtractor 80 is coupled to the audio output terminal 15 and a second input terminal of adder 140.

An output terminal of adder 140 is coupled to an input of an inverting gain controlled amplifier 150 having a gain b which varies between 0 and a very large value, as determined by a gain control signal applied to terminal 25. The output terminal of gain controlled amplifier 150 is coupled to a second input terminal of adder 20, a third input terminal of adder 140 and a subtrahend input terminal of subtractor 80.

In operation, an expanded audio signal, designated by its Fourier transform $W(f,b)$ is produced at output terminal 15 and may be described mathematically as:

$$W(f,b) = \frac{b + H(f)}{1 + bH(f)} X(f). \qquad (4)$$

where $H(f)$ is as described in equation 2 above. When b=0, output signal $W(f,b)=H(f)X(f)$ illustrated as response curve 104 in FIG. 2; when b is very large, output signal $$W(f,b) = \frac{1}{H(f)} X(f)$$

illustrated as response curve 102 in FIG. 2; when b=1, then output signal $W(f,b)=X(f)$, and a flat transfer function response characteristic is provided by the network. Variable preemphasis/deemphasis network 2 provides complementary frequency response characteristics in response to reciprocal valued control signals. That is $Q(f,b)=Q^{-1}(f,1/b)$.

FIG. 4 illustrates an alternative embodiment of a variable preemphasis/deemphasis network 2 which may be used in the spectral expander of FIG. 1B (or the spectral compressor of FIG. 1A). Elements similar to those in FIG. 3 are designated by the same reference numbers, operate in a similar manner, and are not discussed in detail below. Audio input terminal 5 is coupled to respective input terminals of a signal value doubler 10 and adders 20 and 30. An output terminal of adder 30 is coupled to an audio output terminal 15.

An output terminal of signal doubler 10 is coupled to a first input terminal of a further adder 40. An output terminal of adder 40 is coupled to a signal input terminal of an inverting gain controlled amplifier 50, having a gain b which may be varied between 0 and a very large value, as determined by a gain control signal applied to terminal 25. An output terminal of gain controlled amplifier 50 is coupled to a second input terminal of adder 20 and a second input terminal of adder 40. An output terminal of adder 20 is coupled to an input terminal of a signal filter 60 having the transfer characteristic $H(f)-1$. $H(f)$ may be the BTSC noise reduction transfer function as given in equation (2) above. An output terminal of signal filter 60 is coupled to a second input of adder 30 and a third input of adder 40.

The transfer characteristic of the variable preemphasis/deemphasis network 2 illustrated in FIG. 4 is identical to the transfer characteristic of the variable preemphasis/deemphasis network 2 illustrated in FIG. 3.

Figure 5:
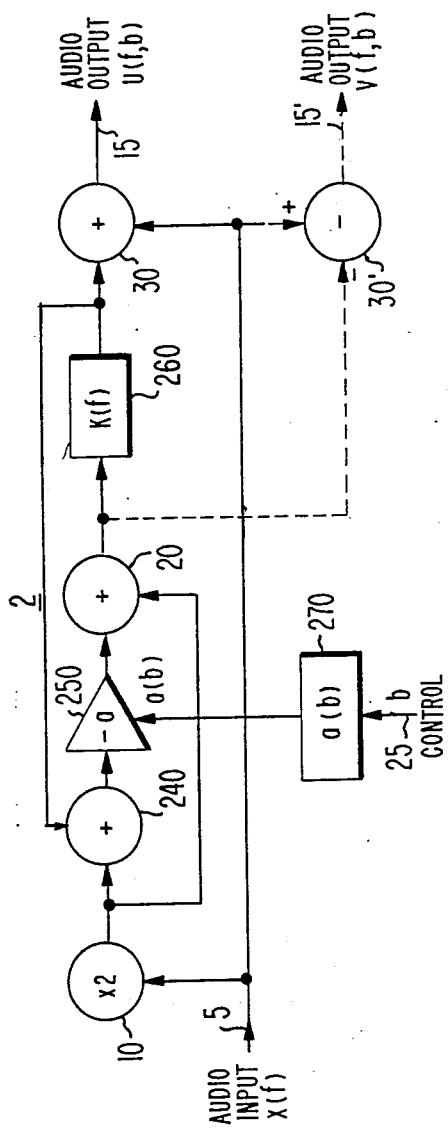

FIG. 5 illustrates an alternative embodiment of a variable preemphasis/deemphasis network. Elements similar to those in FIGS. 3 and 4 are designated by the same reference number, operate in a similar manner, and are not discussed in detail below.

In FIG. 5, an audio input terminal 5 is coupled to a signal value doubler 10 and a first input terminal of an adder 30. An output terminal of adder 30 is coupled to an audio output terminal 15, which generates a signal designated by its Fourier transform $U(f,b)$.

An output terminal of signal value doubler 10 is coupled to respective first input terminals of adders 240 and 20. An output terminal of adder 240 is coupled to an input terminal of an inverting gain controlled amplifier 250 having a gain a. An output terminal of gain controlled amplifier 250 is coupled to a second input terminal of adder 20. An output terminal of adder 20 is coupled to an input terminal of a signal filter 260 having a transfer function $K(f)$, described below. An output terminal of signal filter 260 is coupled to respective second input terminals of adders 30 and 240.

A control input terminal 25, which receives a control signal having the value b, is coupled to an input terminal of a function generator 270, which generates a function a (described below) of control signal b. An output terminal of function generator 270, which carries a signal having the value a(b), is coupled to a gain control terminal of gain controlled amplifier 250.

In operation, the variable preemphasis/deemphasis network 2 of FIG. 5 offers additional flexibility in choosing gain function a(b) and filter transfer function characteristic $K(f)$ while exhibiting the response characteristic defined in equation (7). The transfer function characteristic of the network 2 is:

$$U(f,a) = \frac{1 + (2 - a(b))K(f)}{1 + a(b)K(f)} X(f) \quad (5)$$

A wide choice of filter transfer characteristics $K(f)$ and of gain functions a(b) to achieve the performance expressed by equation (1) is provided. The function a(b) and transfer characteristic $K(f)$ in equation (5) are related to the control signal value b and transfer characteristic $H(f)$ in equation (1) in the following manner:

$$a(b) = 1 + \frac{m(b-1)}{b+1} \quad (6)$$

$$K(f) = \frac{1}{-1 + \frac{m(H(f)+1)}{H(f)-1}}, \quad (7)$$

where m is a constant not equal to zero. Because both a(b) and $K(f)$ in equations (6) and (7) above are functions of the constant m, a change to the transfer characteristic $K(f)$ due to a change in m, is compensated by a change to the function a(b). Thus, m may be chosen arbitrarily without changing the performance of the network.

An alternative network is shown in phantom in FIG. 5. In this embodiment, adder 30 is omitted. Instead, a subtractor 30' has a minuend terminal coupled to audio input terminal 5, a subtrahend input terminal coupled to the output terminal of adder 20, and an output terminal coupled to audio output terminal 15'. Audio output terminal 15' produces a signal designated by its Fourier transform $V(f,b)$.

The transfer function characteristic of the network shown in phantom is:

$$V(f) = \frac{1 + (2 - a^{-1}(b)) K^{-1}(f)}{1 + a^{-1}(b) K^{-1}(f)} X(f) \quad (8)$$

In equation (8), the gain function a(b) and transfer characteristic $K(f)$ are related to the control signal b and transfer characteristic $H(f)$ in equation (1) in the following manner:

$$1/a(b) = a^{-1}(b) = 1 + m\frac{b-1}{b+1} \quad (9)$$

$$1/K(f) = K^{-1}(f) = \frac{1}{-1 + \frac{m(H(f)+1)}{H(f)-1}} \quad (10)$$

For the BTSC network with $H(f)$ as defined in equation (2), various choices of m are possible. For example, if $$m = -\frac{(c-1)}{(c+1)} = -25/26 \quad (11)$$

where c=51, as in equation 2 above, then $K(f)$ and a(b) for audio output signal $V(f,b)$ of the phantom embodiment are:

$$K(f) = \frac{0.733}{jf} ; \text{ and} \quad (12)$$

$$a(b) = 26 \frac{b+1}{b+51} \quad (13)$$

where f is the frequency in kHz. In this case, $K(f)$ represents a simple integrator while a(b) is a more complex function of b.

For the audio output signal $U(f,b)$ of the non-phantom embodiment:

$$K(f) = \frac{jf}{0.733} \quad (14)$$

$$a(b) = \frac{b+51}{26(b+1)} \quad (15)$$

where f is the frequency in kHz. In thise case, K(f) is a simple differentiator.

Another choice is:

$$m = -1 \qquad (16)$$

For an output V(f,b) of the phantom embodiment, the function a(b) and transfer characteristic K(f) are:

$$a(b) = \frac{b+1}{2} \qquad (17)$$

$$K(f) = \frac{2}{c-1}\left(1 + \frac{1}{p}\right) \qquad (18)$$

where $p = jf/f_p$, f is the frequency in kHz, $f_p = 20.1$ kHz, and $c = 51$, as in equation 2, above. This is a compromise yielding a system in which both a(b) and K(f) are comparatively simple to implement.

If adders 240, 20 and 30 in the non-phantom embodiment of FIG. 5 are replaced with subtractors; and inverting gain controlled amplifier 250 is replaced with a non-inverting amplifier, then the transfer characteristic of variable preemphasis/deemphasis network 2 remains identical to that in equation 1. Alternatively, in the phantom configuration in addition to the above modifications, subtractor 30' is replaced by an adder to retain the identical transfer characteristic.

Figure 6:
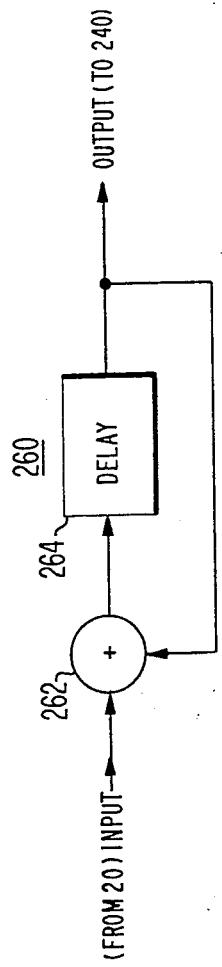
FIG. 6 is a block diagram of a sampled data signal filter which may be used in the variable preemphasis/deemphasis network illustrated in FIG. 5.

FIG. 6 illustrates a sampled data embodiment of a signal filter 260 which may be used to implement the transfer function $$K(f) = \frac{0.733}{jf}$$

of equation 12. This transfer function may be used in the variable preemphasis/deemphasis network 2 illustrated in phantom in FIG. 5 to produce the signal V(f,b).

In FIG. 6, an input terminal is coupled to the output of adder 20 of FIG. 5. The input terminal is coupled to a first input terminal of an adder 262. An output terminal of adder 262 is coupled to an input terminal of a delay element 264. Delay element 264 produces an output signal which is delayed by one sample period relative to its input signal. The output of delay element 264 is coupled to a second input terminal 262 and an output terminal. The output terminal is coupled to an input terminal of adder 240 of FIG. 5.

In operation, signal filter 260 of FIG. 6 exhibits a transfer function which may be described mathematically in the z domain as $$\frac{1}{z-1}.$$

When mathematically translated into the frequency (f) domain, this becomes 1/jf. When a scaling factor is applied in a known manner, the transfer function:

$$K(f) = \frac{0.733}{jf}$$

results, as in equation (12).

The variable preemphasis/deemphasis networks 2 illustrated in FIGS. 3, 4 and 5 each have single signal filters. In FIG. 3, the response characteristic of the signal filter is H(f), in FIG. 4 its response characteristic is H(f)−1, and in FIG. 5 its response characteristic is K(f) (as given above in equations 7 and 10), where H(f) is the BTSC deemphasis transfer function as given in equation (2) above and K(f) is related to the BTSC deemphasis transfer function H(f) by a constant m.

Three embodiments of variable preemphasis/deemphasis networks have been illustrated in this application. Other embodiments in accordance with the principles of this invention may be derived and are considered to be within the scope of the claims of the present invention.

The illustrated embodiments are implemented in continuous analog function. Such a filter could be implemented in either continuous or sampled data form. Sampled data implementations may be implemented in either analog or digital form.

Matching delays and synchronizing latches may be required between particular circuit elements in the above embodiments which would be known to one skilled in the art. Such elements have not been included for simplicity of illustration. Also, protection against arithmetic errors induced by overflow or underflow may be necessary. This protection may include prescaling of signals in certain signal paths with compensating equalizing scaling of signals in other paths. Such protection means also would be known to one skilled in the art, and have not been included for simplicity of illustration.

What is claimed is:

1. A variable signal filtering network coupled to network input and output terminals and to a source of a control signal, comprising:
   a single signal filter having an input terminal and an output terminal, and having a predetermined transfer function;
   a gain controlled amplifier having a signal input terminal, a signal output terminal, and having a control input terminal responsive to said control signal; and
   means for forming the serial connection of at least said gain controlled amplifier and said signal filter between said network input and output terminals and including means for coupling the output terminal of said gain controlled amplifier to the input terminal of said signal filter for conditioning said variable signal filtering network to exhibit one of a family of transfer characteristics which may vary between an emphasis characteristic and a complementary deemphasis characteristic in response to said control signal, and to exhibit complementary transfer function characteristics in response to reciprocally related values of said control signal, wherein the one of said family of transfer characteristics exhibited is controlled solely by said gain controlled amplifier responsive to said control signal.

2. The variable signal filtering network of claim 1, comprising:
   a signal value doubling element, a first adder, said gain control amplifier, a second adder, said signal filter and a third adder serially coupled between said network input and output terminals; wherein:
   said network input terminal is coupled to second input ports of said second and third adders; and
   junctions between said gain control amplifier and said second adder and between said signal filter and said third adder are respectively coupled to second and third input ports of said first adder.

3. The variable signal filtering network of claim 2, wherein the transfer function of said signal filter is $H(f) - 1$.

4. The variable signal filtering network of claim 2, wherein said gain controlled amplifier is an inverting amplifier and exhibits a gain of b.

5. The variable signal filtering network of claim 1 comprising:
   a first adder, said gain control amplifier, a second adder, said signal filter and a subtractor serially coupled between said network input and output terminals; wherein:
   said network input terminal is coupled to a second input port of said second adder;
   a junction between said gain control amplifier and said second adder, and said network output terminal are respectively coupled to second and third input ports of said first adder; and
   said junction is coupled to a second input port of said subtractor.

6. The variable signal filtering network of claim 5, wherein the transfer function of said signal filter is $H(f)$.

7. The variable signal filtering network fo claim 5, wherein said gain controlled amplifier is an inverting amplifier and exhibits a gain of b.

8. The variable signal filtering network of claim 1 comprising:
   a signal value doubling element, a first adder, said gain controlled amplifier, a second adder, said signal filter, and a third adder coupled between said network input and output terminals; and
   a function generator responsive to said control signal and having an output terminal coupled to said control input terminal of said gain controlled amplifier; wherein:
   said network input terminal is coupled to a second input terminal of said third adder;
   a junction between said signal value doubling element and said first adder is coupled to a second input terminal of said second adder; and
   a junction between said signal filter and said third adder is coupled to a second input terminal of said first adder.

9. The variable signal filtering network of claim 8, wherein the transfer function of said signal filter is $$K(f) = \frac{1}{-1 + \frac{m(H(f) + 1)}{H(f) - 1}},$$

where m is a constant.

10. The variable signal filtering network of claim 8, wherein said gain controlled amplifier is an inverting amplifier and exhibits a gain:

$$a(b) = 1 + \frac{m(b - 1)}{b + 1},$$

where m is a constant.

11. A variable signal filtering network coupled to network input and output terminals and a source of a control signal, comprising:
   a signal filter having an input terminal and an output terminal;
   a gain controlled amplifier having a signal input terminal a signal output terminal, and a control input terminal responsive to said control signal;
   a signal value doubling element having input and output terminals;
   first and second adders having respective first and second input terminals and respective output terminals;
   a subtractor having first and second input terminals and an output terminal;
   means for serially coupling said signal value doubling element, said first adder, said gain controlled amplifier, said second adder, and said subtractor between said network input and output terminals wherein the respective first input terminals of said adders and subtractor are used in forming the serial coupling;
   means for coupling said signal filter between a junction between said second adder and said subtractor, and said second input terminal of said first adder; and
   a function generator responsive to said control signal and having an output terminal coupled to said control input terminal of said gain controlled amplifier;
   means for coupling said network input terminal to said second input terminal of said subtractor;
   means for coupling a junction between said signal value doubling element and said first adder to said second input terminal of said second adder; and
   wherein said signal filtering network is conditioned by said control signal to exhibit one of a family of transfer characteristics which may vary between an emphasis characteristic and a complementary deemphasis characteristic in response to said control signal, and to exhibit complementary transfer function characteristics in response to reciprocally related values of said control signal.

12. The variable signal filtering network of claim 11, wherein the transfer function of said signal filter is $$K(f) = -1 + \frac{m(H(f) + 1)}{H(f) - 1},$$

where m is a constant.

13. The variable signal filtering network of claim 11, wherein said gain controlled amplifier is an inverting amplifier and exhibits a gain:

$$a(b) = \frac{1}{-1 + \frac{m(b - 1)}{b + 1}},$$

where m is a constant.

14. The variable signal filtering network of claim 1 comprising:
   a signal value doubling element, a first subtractor, said gain controlled amplifier, a second subtractor, said signal filter, and a third subtractor coupled between said network input and output terminals; and
   a function generator responsive to said control signal and having an output terminal coupled to said gain controlled amplifier; wherein:
   said network input terminal is coupled to a second input terminal of said third subtractor;
   a junction between said signal value doubling element and said first subtractor is coupled to a second input terminal of said second subtractor;
   a junction between said signal filter and said third subtractor is coupled to a second input terminal of said first subtractor.

15. The variable signal filtering network of claim 14, wherein the transfer function of said signal filter is $$K(f) = \frac{1}{-1 + \frac{m(H(f) + 1)}{H(f) - 1}},$$

where m is a constant.

16. The variable signal filtering network of claim 14, wherein said gain controlled amplifier is a non-inverting amplifier and exhibits a gain:

$$a(b) = 1 + \frac{m(b - 1)}{b + 1},$$

where m is a constant.

17. A variable signal filtering network coupled to network input and output terminals, and a source of a control signal, comprising:
- a signal filter having an input terminal and an output terminal;
- a gain controlled amplifier having a signal input terminal, a signal output terminal, and a control input terminal responsive to said control signal;
- a signal value doubling element;
- first and second subtractors having respective first and second input terminals and respective output terminals;
- an adder having first and second input terminals and an output terminal;
- means for serially coupling, in the order recited, said signal value doubling circuit, said first subtractor, said gain controlled amplifier, said second subtractor and said adder between said network input and output terminals, wherein the respective first input terminals, of the respective subtractors and adder are used for the serial coupling;
- means for coupling said signal filter between a junction between said second subtractor and said adder, and said second input terminal of said first subtractor;
- a function generator responsive to said control signal and having an output terminal coupled to said control input terminal of said gain controlled amplifier;
- means for coupling said network input terminal to said second input terminal of said adder; and
- means for coupling a junction between said signal value doubling element and said first subtractor to said second input terminal of said second subtractor;
- wherein said signal filtering network is conditioned to exhibit one of a family of transfer characteristics which may vary between an emphasis characteristic and a complementary deemphasis characteristic in response to said control signal, and to exhibit complementary transfer function characteristics in response to reciprocally related values of said control signal.

18. The variable signal filtering network of claim 17, wherein the transfer function of said signal filter is $$K(f) = -1 + \frac{m(H(f) + 1)}{H(f) - 1},$$

where m is a constant.

19. The variable signal filtering network of claim 17, wherein said gain controlled amplifier is a non-inverting amplifier and exhibits a gain:

$$a(b) = \frac{1}{1 + \frac{m(b - 1)}{b + 1}},$$

where m is a constant.

* * * * *